(12) United States Patent
Yoshihara

(10) Patent No.: US 7,564,102 B2
(45) Date of Patent: Jul. 21, 2009

(54) SEMICONDUCTOR DEVICE AND ITS MANUFACTURING METHOD

(75) Inventor: Takuya Yoshihara, Tokyo (JP)

(73) Assignee: Seiko Epson Corporation, Tokyo (JP)

( * ) Notice: Subject to any disclaimer, the term of this patent is extended or adjusted under 35 U.S.C. 154(b) by 473 days.

(21) Appl. No.: 10/507,615

(22) PCT Filed: Mar. 7, 2003

(86) PCT No.: PCT/JP03/02762

§ 371 (c)(1),
(2), (4) Date: Sep. 14, 2004

(87) PCT Pub. No.: WO03/079444

PCT Pub. Date: Sep. 25, 2003

(65) Prior Publication Data

US 2005/0110098 A1    May 26, 2005

(30) Foreign Application Priority Data

Mar. 15, 2002   (JP)   ............................. 2002-072958

(51) Int. Cl.
*H01L 27/088* (2006.01)
(52) U.S. Cl. ................................................ 257/369
(58) Field of Classification Search .................. 257/407, 257/574, 555, 525, 512, 511, 371, 369, 357, 257/351, 350, 338, 274, 206, E31.085; 438/592
See application file for complete search history.

(56) References Cited

U.S. PATENT DOCUMENTS

| 5,567,642 A | 10/1996 | Kim et al. |
| 6,027,961 A | 2/2000 | Maiti et al. |
| 6,103,609 A * | 8/2000 | Lee et al. ................... 438/592 |
| 6,376,888 B1 * | 4/2002 | Tsunashima et al. ........ 257/407 |
| 2002/0020861 A1 | 2/2002 | Ohmi et al. |

FOREIGN PATENT DOCUMENTS

| JP | 8-213481 A | 8/1996 |
| JP | 10-64898 A | 3/1998 |
| JP | 2000-138373 A | 5/2000 |
| JP | 2000-223588 A | 8/2000 |
| JP | 2000-243853 A | 9/2000 |

(Continued)

*Primary Examiner*—Davienne Monbleau
*Assistant Examiner*—Monica D Harrison
(74) *Attorney, Agent, or Firm*—Sughrue Mion, PLLC

(57) ABSTRACT

A method for manufacturing a semiconductor device wherein both the threshold voltages of an N-type MISFET and a P-type MISFET are low, device can be easily manufactured at a lower cost and a higher product yield, and the reliability of the gate insulation film is higher. The gate insulation film is formed on the surface of a silicon substrate 1 in N-type MISFET forming region and the P-type MISFET forming region, and metal gates 4 and 5 are provided thereon. The metal gate 4 is made from a TiCoN film, and the work function thereof is set at 4.0 to 4.8 eV suited to the gate electrode material of the N-type MISFET. The metal gate 5 is formed from a portion of the TiCoN film by ion-implantation of oxygen into the TiCoN film configuring the gate electrode 4 at a dosage of 1013 to 1014 (ions/cm2) to raise the work function by around 0.2 to 0.8 eV.

19 Claims, 9 Drawing Sheets

FOREIGN PATENT DOCUMENTS

| | | |
|---|---|---|
| JP | 2000-315789 A | 11/2000 |
| JP | 2001-68662 A | 3/2001 |
| JP | 2001-156291 A | 6/2001 |
| JP | 2001-274381 A | 10/2001 |
| JP | 2001-298193 A | 10/2001 |

* cited by examiner (a)

(b)

SEMICONDUCTOR DEVICE AND ITS MANUFACTURING METHOD

FIELD OF THE INVENTION

The present invention relates to a semiconductor device and a method for manufacturing the same, and more particularly, to a semiconductor device, which includes an N-channel metal-insulator-semiconductor field-effect transistor (MISFET) and a p-channel MISFET both having metal gates and is capable of reducing a threshold voltage of each of the FETs to realize a higher operational speed.

BACKGROUND TECHNOLOGY

For increasing the integration density as well as improving the performances of semiconductor devices, development of finer structures has been achieved for the MISFETs constituting the semiconductor device. However, since the finer structure of the MISFET increases the influence by the short-channel effect thereof, it is an important subject to reduce the short-channel effect. Among other proposals for the suppression of the short-channel effect based on the technique in accordance with a so-called scaling rule, a proposal uses a reduced thickness of the gate insulation film. This technique suppresses the short-channel effect by reducing the thickness of the gate insulation film, in order to easily control the depletion layer formed in the Si substrate while applying a voltage to the gate insulation film.

However, if the gate electrode of the MISFET is made from polysilicon doped with impurities, there occurs a phenomenon that the depletion layer is formed also in the gate electrode in the case where the electric field applied to the gate electrode is relatively stronger due to the thickness reduction of the gate insulation film. This results in a larger effective thickness of the gate insulation film.

For solving this depletion problem of the gate electrode, there is a proposal that the gate electrode should be made from a metallic material. The metal gate made from the metallic material has the advantages of reduction in the resistance of the gate electrode and suppression of boron penetration, in addition to the advantage of above suppression of the gate electrode. Thus, the metal gate made of Al, W, WTi or nitride thereof was used in the initial stage of development of the MIS semiconductor devices.

However, there are following problems in the metal gate. For example, since Al has a melting point of as low as about 660 degrees C., a heat treatment at a temperature of equal to or above 400 degrees C., if performed for the purpose of activation of the source and drain, raises the problems of disconnection of the gate electrode and diffusion of the Al atoms into the peripheral area. In addition, there is a problem in that W changes the characteristic thereof due to oxidation. Furthermore, there is problem in that W and WTi have lower resistances against cleaning and are dissolved during an acid cleaning treatment.

Assuming that the gate electrode is made of a TiN film, for example, which is controlled in the alignment thereof, the work function of the gate electrode is improved in the reproducibility thereof. Thus, study for using the TiN as the gate electrode material has been conducted, as described in Patent Publication JP-A-2001-15756, for example. However, since the work function of the TiN is around 4.6 eV, and thus resides in the vicinity of midgap of silicon, i.e., in the intermediate value between the Ec and the Ev of the silicon substrate, both the N-type MISFET and P-type MISFET have higher threshold voltages (Vth). More specifically, a finer structure of the device employed in accordance with the scaling rule, the power dissipation will increase. Although it is generally effective to reduce the power supply voltage for reduction of the power dissipation, the threshold voltage must be reduced accordingly. If the metal gate is made of TiN, the threshold voltage (Vth) is excessively high for the MISFET of a sub-100-nm gate-length generation, as a result of which there arises the problem that the current driveability thereof is decreased.

In view of the above, metal gate materials for the N-type MISFET and P-type MISFET are desired which are capable of suppressing the thresholds of the N-type MISFET and P-type MISFET. It is impossible to significantly change the work function of the metal by adjusting the impurity concentration thereof, unlike the polysilicon. Thus, for changing the threshold of the metal gate, it is necessary to employ different kinds of metals configuring the gate electrode. Examples of the proposed metallic materials having work functions around 4 eV suited to the gate metal of the N-type MISFET (hereinafter referred to as N-type MIS metal) include Hf, Zr, Al, Ti, Ta and Mo. Examples of the metallic materials having work functions around 5 eV suited to the P-type MISFET (referred to as P-type MIS metal) include $RuO_2$, WN, Ni, Ir, $Mo_2N$, TaN and Pt. Table 1 tabulates the work functions of metals recited in literatures. The work functions shown in Table 1 are values recited in literature "Applied Physics, vol. 69, No. 1 (2000), pp 4-14", literature "Journal of Vacuum Science and Technology B16(2) pp. 829 (1998) etc. Satisfactorily lower threshold voltages can be obtained for both the N-type MISFET and P-type MISFET by a combination of one of the above metallic materials selected as the gate electrode material for the N-type MISFET and one of the above metallic materials selected as the gate electrode material for the P-type MISFET.

TABLE 1

| Metal Gate Material | Work Function (eV) |
|---|---|
| Hf | 3.9 |
| Zr | 4.05 |
| ZrN | 4.7 |
| Al | 4.08 |
| Ti | 4.17 |
| Ta | 4.19 |
| Mo | 4.2 |
| W | 4.52 |
| TiN | 4.7 |
| Ru | 4.71 |
| RuO2 | 4.9 |
| WN | 5.0 |
| Ni | 5.15 |
| Ir | 5.27 |
| Mo2N | 5.33 |
| TaN | 5.41 |
| Pt | 5.65 |

However, it is very difficult to manufacture a device including such N-type MISFET and P-type MISFET by using a conventional technique for manufacturing the device. The reasons therefor will be described hereinafter. For differentiating the gate electrodes of the N-type MISFET and P-type MISFET in the fabrication, it is necessary to form an N-type MIS metallic film on the substrate, detach the N-type MIS metallic film in the area for forming therein the P-type MISFET and form a P-type MIS metallic film therein. However, since the metal for configuring the gate electrode must be chemically stable, the metal is difficult to etch accordingly and is likely to damage the gate oxide film. In the submicron MISFETs, since the gate oxide film has a thickness of 2 nm or less, it is very difficult to detach the N-type MIS metallic film without damaging the gate oxide film, and also difficult to reform a gate oxide film having an excellent property. In addition, since different kinds of metals configuring the gate electrodes need different process conditions, there arise the problems of complex adjustments of the process conditions as well as impossibility of employing common process conditions. Further, these metals must satisfy a variety of conditions such as excellent resistance against the cleaning accompanied by detachment of the gate metal, effective prevention of channeling during ion implantation after configuration of the gate electrodes, stability of interface between the gate electrode and the gate oxide film during a heat treatment reaching up to a temperature of about 1000 degrees C. etc.

Another technique in accordance with the scaling rule is known which forms dummy gate electrodes on the gate oxide film of the P-type MISFETs, deposits a metallic film over an entire area for use as the gate electrodes of the N-type MISFETs, removes the dummy gate electrodes and deposits another metallic film on the gate oxide film of the P-type MISFETs for use as the gate electrodes of the P-type MISFETs. This technique also includes the step of removing the dummy gate electrodes formed on the gate insulation film, and damages the gate insulation film in the process.

Thus, a technique using a damascene process is proposed for solving the problems accompanied by the etching of the gate electrode and the heat treatment for activating the source and drain. Patent Publication JP-A-2000-315789, for example, describes in the first embodiment thereof the technique as detailed below. A $HfO_2$ film is formed as a gate insulation film in the trenches of gate portions of the N-type MISFET and P-type MISFET formed as depressions, followed by forming a HfN film. Thereafter, the portion other than the gate electrodes of the P-type MISFETs is protected by a resist, followed by selectively removing the HfN film on the gate electrode portions of the P-type MISFETs by using a hydrogen peroxide solution. Subsequently, a Co film is deposited in the entire area. This provides layered films including HfN film and Co film for the gate electrodes of the N-type MISFETs, whereas a single Co film for the gate electrodes of the P-type MISFETs. Thus, two kinds of different gate electrodes can be formed for the N-type MISFETs and P-type MISFETs. The HfN film has a small thickness of around 10 nm for the purpose of preventing the etching from proceeding in the lateral direction during the etching removal of the HfN film. JP-A-2000-315789 recites that such a structure provides lower threshold voltages for both the N-type MISFETs and P-type MISFETs.

However, since the threshold voltage of the MISFET is strongly affected by the situation of the electrons in the interface between the gate insulation film and the gate electrode, the threshold voltage of the MISFET varies widely to cause a lower product yield of the semiconductor devices unless the HfN film formed in the trenches is completely removed. The complete removal of the HfN film and the protection of the gate insulation film are tradeoffs and thus very difficult to be compatible. Furthermore, the two kinds of gate electrodes, if formed by the damascene process, raises the problem of complicating the process to increase the fabrication cost and reduce the product yield.

For solving the problems of detachment of the metallic film as described before, another technique is proposed which uses ion-implantation of nitrogen into a Mo film. For example, Qiang Lu et al. disclose a technique for depositing a Mo film for use as the gate electrodes of the N-type MISFET and P-type MISFET, followed by controlling the work function of the P-type MISFET by ion-implantation of nitrogen into only the gate electrode of the P-type MISFET. Using this technique, the absence of the step of detaching the gate electrode in contact with the gate insulation film solves the problem of complicated process accompanied by the detachment of the metal and the wide range of variation of the threshold.

However, the above conventional technique involves the problems as shown hereinafter. In the technique of ion-implantation of nitrogen into the Mo film, the pure metal, Mo, in direct contact with the silicon oxide film in the N-type MISFET raises the problem of degradation of the thermal stability of the interface. In addition, the ion-implantation of nitrogen into the Mo film allows the nitrogen to be introduced also into the silicon oxide film, or gate insulation film, thereby involving the problem of degrading the long-term reliability of the gate insulation film.

DISCLOSURE OF THE INVENTION

In view of the above problems, the present invention is devised to provide a semiconductor device having lower threshold voltages, capable of being manufactured at a low cost with a higher product yield and including a gate insulation film having a higher reliability, and a method for manufacturing the same.

The present invention provides, in a first aspect thereof, a semiconductor device including a metal-insulator-semiconductor field-effect transistor, characterized in that the metal-insulator-semiconductor field-effect transistor includes a gate electrode made from a metallic, alloy or metal nitride film doped with oxygen or fluorine.

In accordance with the semiconductor device of the first aspect of the present invention, due to the gate electrode being made from a metallic, alloy or metal nitride film doped with oxygen or fluorine, the work function of the gate electrode can be arbitrarily controlled. This allows a metal gate having a lower threshold voltage to be formed with ease. In addition, since ion-implantation of nitrogen into the gate electrode is not needed upon forming this metal gate, the reliability of the gate insulation film is not damaged. The oxygen or fluorine, introduced into the gate electrode, does not damage the long-term reliability of the gate insulation film. It is to be noted that the "metal nitride" used in this text includes a nitride of a pure metal and a nitride of an alloy.

The present invention provides, in a second aspect thereof, a semiconductor device including an N-channel metal-insulator-semiconductor field-effect transistor and a P-channel metal-insulator-semiconductor field-effect transistor, characterized in that the N-channel metal-insulator-semiconductor field-effect transistor includes a gate electrode made from a metallic, alloy or metal nitride film doped with oxygen or fluorine, and that the P-channel metal-insulator-semiconductor field-effect transistor includes a gate electrode formed in a common layer with the gate electrode of the N-channel metal-insulator-semiconductor field-effect transistor and made from a portion of the common layer doped with oxygen or fluorine more heavily than the gate electrode of the N-channel metal-insulator-semiconductor field-effect transistor.

The present invention provides, in a third aspect thereof, a semiconductor device including an N-channel metal-insulator-semiconductor field-effect transistor and a P-channel metal-insulator-semiconductor field-effect transistor, characterized in that the N-channel metal-insulator-semiconductor field-effect transistor includes a gate electrode made from a metallic, alloy or metal nitride film, and that the P-channel metal-insulator-semiconductor field-effect transistor includes a gate electrode formed in a common layer with the gate electrode of the N-channel metal-insulator-semiconductor field-effect transistor and made from a portion of the common layer doped with oxygen or fluorine.

In accordance with the semiconductor devices of the second and third aspects of the present invention, the gate electrode of the N-channel metal-insulator-semiconductor field-effect transistor (hereinafter, referred to as N-type MISFET) is made from a material, which is a metal, an alloy or a nitride of a metal (hereinafter referred to collectively as metallic material), and the gate electrode of the P-channel insulated-gage field-effect transistor (hereinafter referred as P-type MISFET) is made from the common layer with the gate electrode of the N-type MISFET, the common layer being doped with oxygen or fluorine. More specifically, the gate materials of the N-type MISFET and the P-type MISFET are differentiated from each other in fabrication thereof by adding oxygen or fluorine into the material which is metal, alloy or nitride of a metal. This allows metal gates having work functions suited to the N-type MISFET and P-type MISFET to be fabricated without difficulty. As a result, the threshold voltages of the N-type MISFET and P-type MISFET can be reduced without involving depletion of the gate electrodes. In addition, since ion-implantation of nitrogen into the gate electrodes is not needed upon forming the gate electrodes, the reliability of the gate insulation film is not damaged.

It is preferable that the material for forming the gate electrode of the N-type MISFET and the gate electrode of the P-type MISFET be polycrystalline or amorphous and have an average grain size of not more than 50 nm.

In general, the work function of a metal differs depending on the plane orientation. Accordingly, if the plane orientation of the material configuring the gate electrodes differs between the gate electrodes, the threshold of each transistor varies significantly to degrade the performance of the semiconductor device. Since the gate length is equal to or less than 100 nm in these days, the variation of the threshold can be prevented so long as the material configuring the gate electrodes is polycrystalline or amorphous and has an average grain size of not more than 50 nm, whereby the resultant transistors can be improved for their performances. It is to be noted that if it is possible to align the plane orientation of the material between the gate electrodes, the material need not be a polycrystalline or amorphous and need not have an average grain size of not more than 50 nm, and thus may be single crystalline, for example.

It is also preferable that the material configuring the gate electrode of the N-channel metal-insulator-semiconductor field-effect transistor and the gate electrode of the P-channel metal-insulator-semiconductor field-effect transistor be made of an alloy including two or more metals selected from the group consisting of Al, Si, Ti, V, Co, Ni, Ge, Zr, Nb, Mo, Ru, Hf, Ta and W or a nitride of the alloy. In this configuration, by adjusting the content ratio of the alloy, the work function of the alloy can be controlled in a wide range. As a result, the threshold of the transistor can be controlled in a wider range.

It is also preferable that the oxygen or fluorine profile of the gate electrode of the P-channel metal-insulator-semiconductor field-effect transistor with respect to a thickness direction thereof have a peak within 5 nm from the interface with the gate insulation film. In this configuration, the influence applied on the work function of the gate electrode of the P-type metal-insulator-semiconductor field-effect transistor by the introduced oxygen can be increased, while reducing the influence on the resistance of this gate electrode. In addition, the resultant introduction of the oxygen into the gate insulation film prevents reduction of the reliability of the gate electrode.

The present invention also provides, in a fourth aspect thereof, a semiconductor device including an N-channel metal-insulator-semiconductor field-effect transistor and a P-channel metal-insulator-semiconductor field-effect transistor, characterized in that each of the N-channel metal-insulator-semiconductor field-effect transistor the P-channel metal-insulator-semiconductor field-effect transistor includes a gate insulation film and a gate electrode formed on the gate insulation film, that one of the gate electrodes includes a first film formed on the gate insulation film and made of a first material which is either a metal, an alloy or a nitride of a metal, and a second film formed on the first film and made of a second material which is either a metal, an alloy or a nitride of a metal, and that the other of the gate electrodes includes a third film formed on the gate insulation film and made of the first material having a larger thickness than the first film.

In accordance with the semiconductor device of the fourth aspect of the present invention, the one of the gate electrodes includes the first and second films, whereas the other of the gate electrodes includes the third film. This results in that the work function of the one of the gate electrodes is affected by the second film to be differentiated from the work function of the other of the gate electrodes. Accordingly, metal gates having work functions suited to the N-type MISFET and the P-type MISFET can be fabricated without difficulty. In addition, since ion-implantation of nitrogen into the gate electrode is not needed, the reliability of the gate insulation film is not damaged.

It is preferable that the first film have an average thickness of not more than 5 nm, and the third film have an average thickness of more than 5 nm. In this configuration, the work function of the one of the gate electrodes is strongly affected by the second film, whereas the work function of the other of the gate electrodes can be strongly affected by the third film. It is to be noted that the average thickness of the first film is obtained by measuring the concentration profile of the first film, and calculating the thickness thereof based on the concentration profile while assuming that the first film is made of only the first material.

The present invention also provides, in a fifth aspect thereof, a semiconductor device including an N-channel metal-insulator-semiconductor field-effect transistor and a P-channel metal-insulator-semiconductor field-effect transistor, characterized in that each of the N-channel metal-insulator-semiconductor field-effect transistor and the P-channel metal-insulator-semiconductor field-effect transistor includes a gate insulation film and a gate electrode formed on the gate insulation film, that one of the gate electrodes includes a first film formed on the gate insulation film and made of a first material which is either a metal, an alloy or a nitride of a metal, and a second film formed on the first film and made of a second material which is either a metal, an alloy or a nitride of a metal, and that the other of the gate electrodes includes the first film and a third film formed on the first film and made of a third material which is either a metal, an alloy or a nitride of a metal.

The present invention also provides, in a sixth aspect thereof, a method for manufacturing a semiconductor device including a metal-insulator-semiconductor field-effect transistor, including the steps of forming a gate insulation film on a semiconductor substrate in an area for forming the metal-insulator-semiconductor field-effect transistor, forming a film made of a metal, an alloy or a metal nitride on the gate insulation film, selectively introducing oxygen or fluorine into the film, selectively removing the film to configure a gate electrode pattern, and implanting impurities into a surface area of the semiconductor substrate by using the gate electrode as a mask to thereby form source and drain.

The present invention also provides, in a seventh aspect thereof, a method for manufacturing a semiconductor device including an N-channel metal-insulator-semiconductor field-effect transistor and a P-channel metal-insulator-semiconductor field-effect transistor, including the steps of forming a gate insulation film on a semiconductor substrate in both the areas for forming the N-channel metal-insulator-semiconductor field-effect transistor and the P-channel metal-insulator-semiconductor field-effect transistor, forming a film made of a metal, an alloy or a metal nitride on the gate insulation film, selectively introducing oxygen or fluorine into the film in the area for forming the P-channel metal-insulator-semiconductor field-effect transistor, selectively removing the film to configure a gate electrode, and selectively implanting impurities into a surface area of the semiconductor substrate by using the gate electrode of the N-channel metal-insulator-semiconductor field-effect transistor and the gate electrode of the P-channel insulated-gage field-effect transistor as a mask to thereby form sources and drains.

In accordance with the semiconductor device manufacturing methods of the sixth and seventh aspects of the present invention, since two kinds of gate materials are formed while being differentiated from each other by implanting oxygen or fluorine, the gate electrodes are fabricated more easily at a smaller cost and with a higher product yield compared to the case where the two kinds of gate materials are separately formed by different processes. In addition, since there is no step of removing the once-deposited metallic film by etching etc., the gate insulation film is not damaged. Further, due to the no damage of the gate insulation film caused by etching and no ion-implantation of nitrogen, the gate insulation film has a higher reliability.

The present invention also provides, in an eighth aspect thereof, a method for manufacturing a semiconductor device including an N-channel metal-insulator-semiconductor field-effect transistor and a P-channel metal-insulator-semiconductor field-effect transistor, including the steps of forming dummy gate electrodes on a semiconductor substrate in both areas for forming the N-channel metal-insulator-semiconductor field-effect transistor and the P-channel metal-insulator-semiconductor field-effect transistor, introducing impurities into a surface area of the semiconductor substrate by using the dummy gate electrodes as a mask to thereby form sources and drains, heat treating for activation of the impurities, forming an interlayer dielectric film so as to embed peripheries of dummy gate electrodes, removing the dummy gate electrodes to thereby form grooves in the interlayer dielectric film, forming a gate insulation film at least in the grooves, forming a film made of a metal, an alloy or a nitride of a metal on the gate insulation film, selectively introducing oxygen or fluorine in the film in the area for forming the P-channel metal-insulator-semiconductor field-effect transistor, and selectively removing the film to thereby configure gate electrodes.

In accordance with the semiconductor device manufacturing method of the eighth aspect of the present invention, dummy gate electrodes are formed, and impurities are implanted and activated, followed by removing the dummy gate electrodes and forming the gate insulation film and gate electrodes. In this configuration, the gate insulation film and gate electrodes are not exposed to a heat treatment, whereby a gate electrode material having a relatively lower heat resistance in the interface between the gate electrode and the gate insulation film can be used.

The present invention also provides, in a ninth aspect thereof, a method for manufacturing a semiconductor device including an N-channel metal-insulator-semiconductor field-effect transistor and a P-channel metal-insulator-semiconductor field-effect transistor, including the steps of forming a gate insulation film on a semiconductor substrate in both areas for forming the N-channel metal-insulator-semiconductor field-effect transistor and the P-channel metal-insulator-semiconductor field-effect transistor, forming on the gate insulation film a first film made of a first material which is a metal, an alloy or a nitride of a metal, forming on the first film a second film made of a second material which is a metal, an alloy or a nitride of a metal, selectively removing the second film in one of the areas for forming the N-channel metal-insulator-semiconductor field-effect transistor and the P-channel metal-insulator-semiconductor field-effect transistor, forming a third film made of the first material in the one of the areas, selectively removing the first through third films to configure gate electrodes of the N-channel metal-insulator-semiconductor field-effect transistor and the P-channel metal-insulator-semiconductor field-effect transistor, and introducing impurities into a surface area of the semiconductor substrate by using the dummy gate electrodes of the N-channel metal-insulator-semiconductor field-effect transistor and the P-channel metal-insulator-semiconductor field-effect transistor as a mask to thereby form sources and drains.

In accordance with the semiconductor device of the ninth aspect of the present invention, two kinds of gate electrodes of the N-type MISFET and the P-type MISFET are formed by layering films made of metal, alloy or nitride of metal. This allows the work functions of the gate electrodes to be controlled at respective optimum values by selecting the kinds and the thicknesses of the layered films. In addition, the work functions of the gate electrodes are controlled to differentiate the gate electrode of the N-type MISFET and the gate electrode of the P-type MISFET in the fabrication without damaging the gate insulation film. As a result, a semiconductor device including an N-type MISFET and a P-type MISFET having lower threshold voltages can be obtained without involving depletion of the gate electrodes. Further, due to absence of the damage of the gate insulation film caused by etching, the reliability of the gate insulation film is not degraded. Further, the feasibility thereof reduces the fabrication cost and raises the product yield.

BEST MODES FOR CARRYING OUT THE INVENTION

The present inventors intensively studied for solving the above problems and found that forming the gate electrodes from an alloy having a specific composition allows the work function of this alloy to be effectively controlled, and that ion-implanting oxygen or fluorine into this alloy allows the work function of this alloy to be effectively changed. This results in that the gate electrode of an N-type MISFET and the gate electrode of a P-type MISFET are differentiated from one another in the fabrication thereof.

Figure 1:
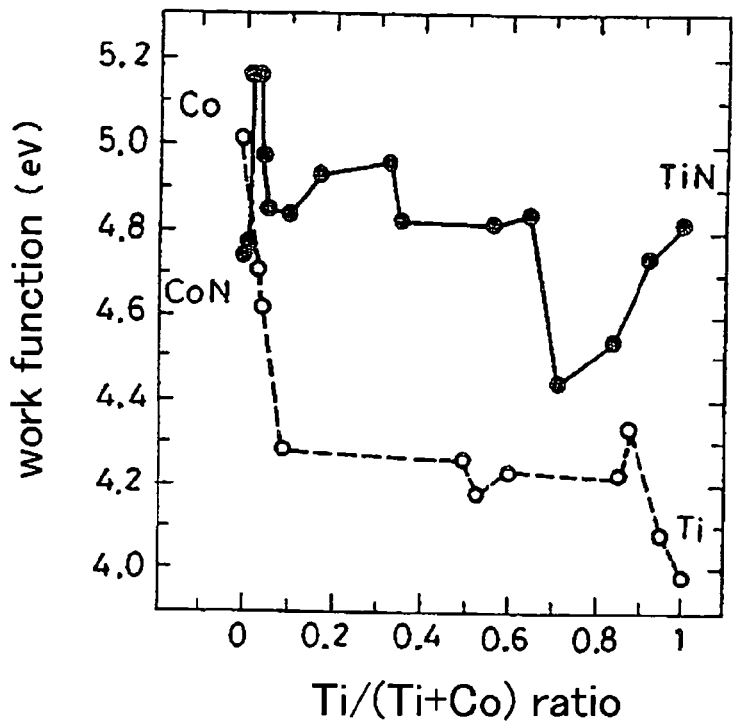
FIG. 1 is a graph showing variation of the work functions of TiCo and TiCoN when the ratio between the numbers of atoms of Ti and Co is changed, wherein the ratio between the numbers of atoms (Ti/(Ti+Co)) is plotted on abscissa and the work functions are plotted on ordinate.
Figure 2:
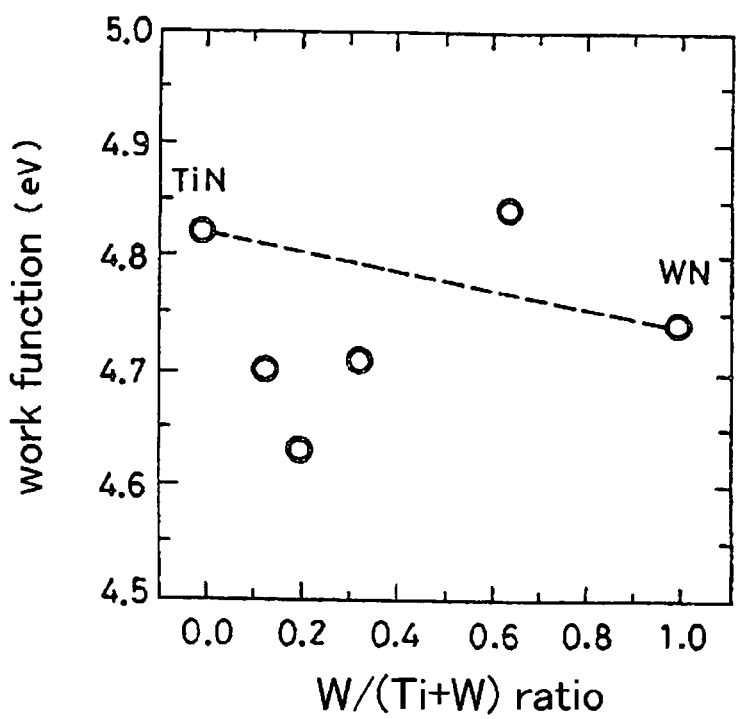
FIG. 2 is a graph showing variation of the work function of TiWN when the ratio between the numbers of atoms of T1 and W is changed, wherein the ratio between the numbers of atoms (W/(Ti+W)) is plotted on abscissa and the work function is plotted on ordinate.
Figure 3:
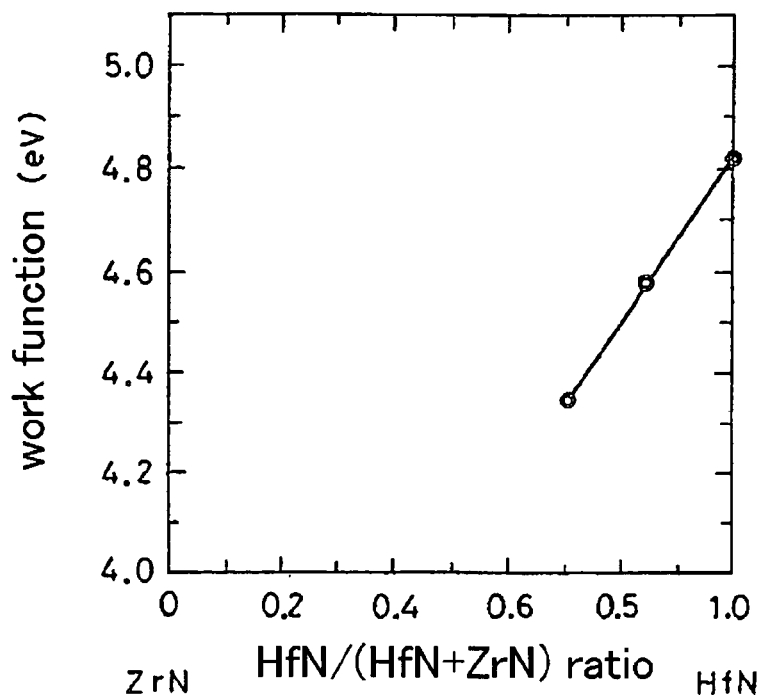
FIG. 3 is a graph showing variation of the work function of HfZrN when the ratio between the numbers of atoms of HfN and ZrN is changed, wherein the ratio between the number of atoms (HfN/(HfN+ZrN)) is plotted on abscissa and the work function is plotted on ordinate.
Figure 4:
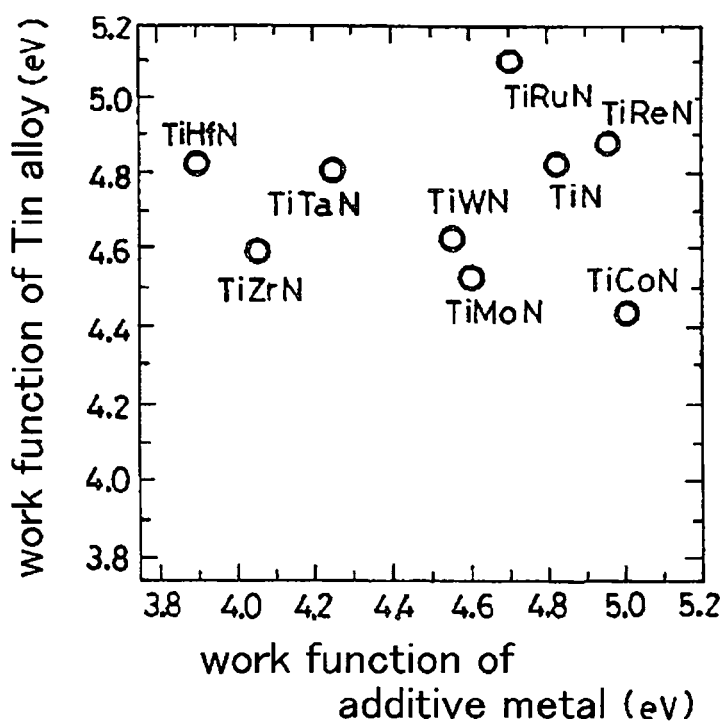
FIG. 4 is a graph showing influence caused on the work function of TiN by a variety of additive metals, wherein the amount of implanted oxygen is plotted on abscissa and the work function of TiCoN is plotted on ordinate.

Referring to FIG. 1, wherein the ratio between the numbers of atoms (Ti/(Ti+Co)) is plotted on abscissa and the work functions are plotted on ordinate, it is shown that work functions of TiCo and TiCoN vary when the ratio between the numbers of atoms of Ti and Co is changed. Referring to FIG. 2, wherein the ratio between the number of atoms (W/(Ti+W)) is plotted on abscissa and the work function is plotted on ordinate, it is shown that the work function of TiWN varies when the ratio between the number of atoms of Ti and W is changed. Referring to FIG. 3, wherein the ratio between the numbers of atoms (HfN/(HfN+ZrN)) is plotted on abscissa and the work function is plotted on ordinate, it is shown that work function of HfZrN varies when the ratio between the numbers of atoms of HfN and ZrN is changed. Referring to FIG. 4, wherein the work functions of additive metals are shown on the abscissa and the work functions of the TiN alloys obtained by adding additive metals into TiN at 10 atomic percents are plotted on ordinate, the influences caused by the additive metals on the work function are shown.

It is to be noted that the values of the work functions shown in FIGS. 1 to 4 were measured in experiments by the present inventors. Some of these values are different to some extent from those recited in the literatures shown in Table 1. This is because the measurement of the work functions is difficult to achieve, and the work function of the same material may differ by about 0.5 eV depending on the plane orientation thereof. In addition, it is likely that some of the literatures recite different work functions. In the present invention, the relative change of the work function is more important than the absolute value of the work function itself, the relative change of the work function depending on the composition of the material of the gate electrode, the oxygen or fluorine concentration thereof and the thickness of the gate electrode. Thus, for the purpose of convenience, the experimental values obtained by the present inventors are used as the work functions in the description to follow.

As shown in FIG. 1, the work function of TiCo changes almost continually from 4.0 eV for Ti to 5.0 eV for Co along with the increase of the Co content. On the other hand, the work function of TiCoN exhibits a change different from that of the work function of the TiCO, does not necessarily assume an intermediate value between the work functions of TiN and CoN, i.e., within 4.75 eV and 4.82 eV, and changes within the range between 4.4 eV and 5.5 eV. By taking advantage of this characteristic, a desired work function can be obtained within the range between 4.4 eV and 5.2 eV while controlling the ratio between Ti and Co in the TiCoN. In addition, it was confirmed that the work function of TiCo added with nitrogen exhibited a continual increase along with the increase of the amount of nitrogen. More specifically, the work function of TiCoN can be adjusted to a work function suited to the N-type MISFET and P-type MISFET by controlling the content ratio between Ti and Co and/or the content of N, with a broader design choice.

As shown in FIG. 2, the work function of the TiWN alloy deviates from the range between the work function of the TiN alloy and the work function of the WN alloy, i.e., from the range between 4.74 eV and 4.82 eV, wherein the work function varies complicatedly with the change of content of the TiWN alloy. In addition, it is recited in "Journal of vacuum Science and Technology B16(2), pp 829 (1998)" that the work function of ZrN assumes about 4.7 eV (refer to Table 1). Accordingly, as shown in Table 1 and FIG. 3, the work function of the HfZrN alloy deviates from the range between the work function of the HfN alloy and the work function of the ZrN alloy, varying complicatedly with the change of the composition of the HfZrN alloy. Such a behavior is similar to the behavior of the TiCoN alloy shown in FIG. 1. In addition, as shown in FIG. 4, there is no clear correlation between the work functions of the additive metals added into TiN and the work functions of the TiN alloys after the addition.

As described above, the present inventors found that the work function of an alloy may sometimes deviate from the range between the work functions of the components constituting the alloy, and that the work function of this alloy changes complicatedly. It was found accordingly that the work function of the alloy can be controlled as desired by selecting the optimum composition of the alloy after investigating the relationship between the composition of the alloy and the work function thereof. It is to be noted that it is difficult to estimate the work function of the alloy from the work functions of the components of the alloy, and that, even if the work function of an alloy having a specific composition is found, it is difficult to estimate the work function of another alloy having the same components as the alloy and different composition from that of the alloy. Thus, it is necessary to experimentally obtain the relationship between the composition of the alloy and the work function thereof, as obtained by the present inventors.

Figure 5:
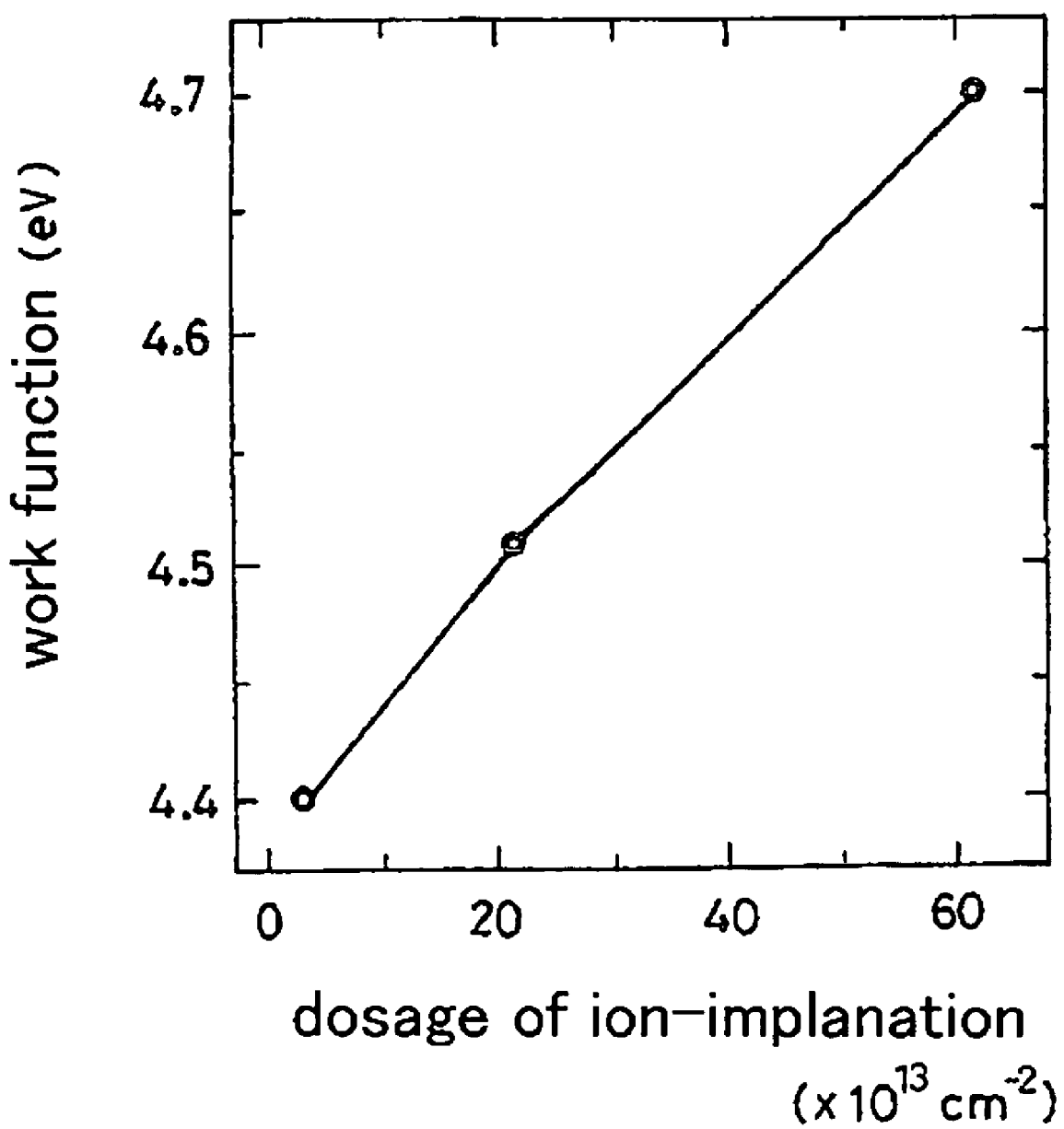
FIG. 5 is a graph showing variation of the work function when oxygen is introduced into TiCoN, wherein the amount of implanted oxygen is plotted on abscissa and the work function TiCoN is plotted on ordinate.

Referring to FIG. 5, wherein the amount of implanted oxygen ions is plotted on abscissa and the work function of TiCoN is plotted on ordinate, the change of the work function when oxygen is ion-implanted into the TiCoN is shown. As understood from FIG. 5, when oxygen is ion-implanted into TiCoN, the work function increases with the increase of the amount of ion-implantation and the behavior of increase is substantially linear.

In a preferred embodiment of the present invention, characteristics shown in FIGS. 1 and 5 are utilized. First, after selecting the species and composition of the alloy, a film made of the metallic material having a work function suited to the gate electrode of the N-type MISFET is deposited in both the areas for forming the N-type MISFET and P-type MISFET. Subsequently, oxygen is ion-implanted into the metallic film in the portion thereof corresponding to the gate electrode of the P-type MISFET, to change the work function of the film in the portion corresponding to the gate electrode of the P-type MISFET into another work function suited to the gate electrode of the P-type MISFET. The species of ions implanted for controlling the work function is not limited to oxygen, and may be fluorine or nitrogen to achieve a similar effect. However, if nitrogen is ion-implanted, the nitrogen ions are received in the gate insulation film, thereby degrading the reliability of the gate insulation film. Oxygen or fluorine does not degrade the gate insulation film, even if these elements are received in the gate insulation film. Thus, the species of implanted ions must be oxygen or fluorine.

As described in the background technology, a technique for ion-implanting nitrogen into the metal gate such as made of Ti or Mo is reported. However, in this technique, for significantly changing the work function of the metal gate, a larger amount of nitrogen must be implanted. A larger amount of nitrogen, if implanted in the gate insulation film, degrades the reliability of the gate insulation film. On the other hand, as shown in Table 2, the electronegativities of oxygen and fluorine are larger than the electronegativities of metallic elements and nitrogen, thereby providing larger electron affinities. Accordingly, ion-implantation of oxygen or fluorine into the gate electrode material even in a small amount can significantly increase the work function of the material. In addition, since the fluorine is an element that may be used for improving a silicon oxide film, for example, and the oxygen is one of the elements that configure the gate insulation film, the reliability of the gate insulation film is not degraded by implanting a small amount of these elements into the gate insulation film. The ion-implantation of oxygen may be considered to increase the resistance due to oxidation of the metal. However, since the amount of oxygen implanted is very small, and the oxygen is localized in the interface between the gate oxide film and the gate electrode, the electric resistance of the gate electrode is scarcely changed.

TABLE 2

| | Element | | | | | |
|---|---|---|---|---|---|---|
| | Ti | Co | W | N | O | F |
| Electronegativity | 1.5 | 1.8 | 1.7 | 3.0 | 3.5 | 4.0 |

The present inventors found that the work function of an alloy including two or more kinds of metals selected from the group consisting of Al, Si, Ti, V, Co, Ni, Ge, Zr, Nb, Mo, Ru, Hf, Ta and W, as well as a nitride thereof, in addition to the above-described TiCoN, TiWN and HfZrN, also largely changes to deviate from the range between the work functions of the metals constituting the alloy. In addition, although there are problems of lower resistances against heat and cleaning if Al and W are used in the gate electrode as pure metals, alloying thereof solves these problems.

Figure 6:
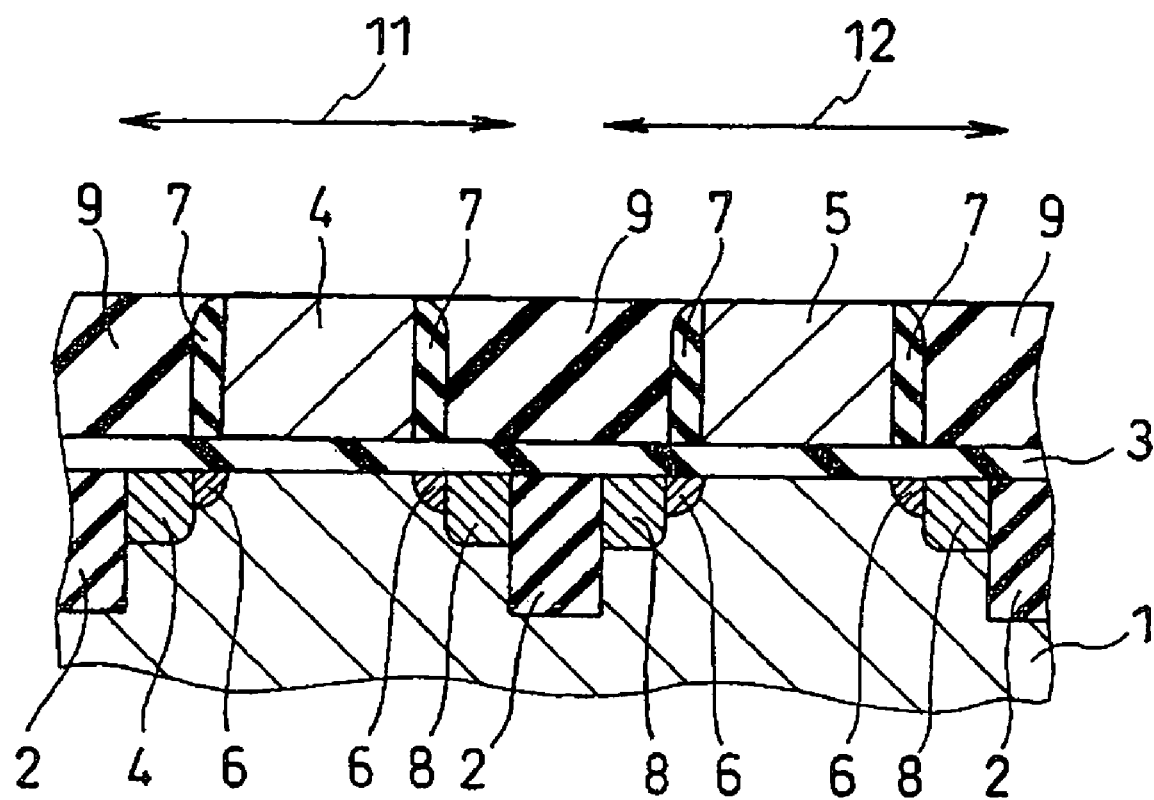
FIG. 6 is a sectional view of a semiconductor device according to a first embodiment of the present invention.

Hereinafter, embodiments of the present invention will be described more concretely with reference to accompanying drawings. For a start, a first embodiment of the present invention will be described. FIG. 6 shows a semiconductor device according to the present embodiment. As shown in FIG. 6, in the semiconductor device of the present embodiment, a silicon substrate 1 is provided, and element isolation regions 2 are selectively formed in the surface area of the silicon substrate 1. An insulation film, such as made of $SiO_2$, is received in the element isolation region 2, and the space between the element isolation regions 2 constitutes an N-type MISFET forming region 11 or a P-type MISFET forming region 12. The depth of the element isolation region 2 is 100 to 500 nm, for example, whereas the distance between the element isolation regions is 0.05 to 10 μm, for example.

In each of the N-type MISFET forming region 11 and P-type MISFET forming region 12 in the surface area of the silicon substrate 1, two diffused regions 8 are formed. The diffused region 8 is formed by implantation of impurity ions into the silicon substrate 1, adjacent to the element isolation region 2. The width of diffused region 8 is 0.1 to 10 μm, for example, and may be 0.2 μm, for example, the depth thereof is 50 to 500 nm, for example, and may be 100 nm, and the impurity concentration thereof is $10^{19}$ to $10^{21}$ $cm^{-3}$, for example. In addition, an extension region 6 is formed adjacent to the diffused region 8 so as to sandwich the diffused region 8 together with the element isolation region 2. The extension region 6 is also formed by ion-implantation of impurities into the silicon substrate 1, and the impurity concentration thereof is equivalent to or lower than that of the diffused region 8. The width of the extension region 6 is 60 nm, for example, the depth thereof is 5 to 200 nm, for example, and the impurity concentration thereof is $10^{19}$ to $10^{21}$ $cm^{-3}$, for example.

On the silicon substrate 1, a gate insulation film 3 made from a silicon oxynitride film and having a thickness of 1 to 3 nm is formed. Metallic gate electrodes 4 and 5 are formed in the N-type MISFET forming region 11 and P-type MISFET forming region 12, respectively, on the gate insulation film 3. The thickness of the metal gates 4 and 5 is 20 to 200 nm, for example, and may be 50 to 100 nm, for example. The metal gate 4 is made of TiCoN having a composition ratio of Co:N=0 to 35:0 to 20, for example, in atomic percent and a work function of 4.0 to 4.8 eV, which is suited to the gate electrode material of the N-type MISFET. The metal gage 5 is made from a material wherein the TiCoN configuring the metal gate 4 is doped with oxygen by ion-implantation at a dosage of about $10^{13}$ to $10^{14}$ (ions/$cm^3$). The material configuring the metal gate 5 has a work function 0.2 to 0.8 eV higher than the work function of the material configuring the gate electrode 4, and may be 4.9 eV, for example, which is suited to the gate electrode material of the P-type MISFET. It is to be noted that the concentration profile of the oxygen in the thickness direction of the metal gate 5 has a peak within 5 nm from the interface with the gate insulation film 3. More specifically, the oxygen in the metal gate 5 is localized in the interface with the gate insulation film 3.

Moreover, around the metal gates 4 and 5, respective side-walls 7 are formed. The side-wall 7 is made from a silicon nitride film, for example. Further, an interlayer dielectric film 9 made of a $SiO_2$, BPSG, SiN or low-dielectric-constant film is formed so as to embed the peripheries of the metal gates 4 and 5 and side-walls 7. The top surfaces of the metal gates 4 and 5 are exposed from the top surface of the interlayer dielectric film 9.

In the above configuration, the silicon substrate 1, pair of diffused regions 8, pair of extension regions 6, gate insulation film 3, metal gate 4 and side-wall 7 constitute the N-type MISFET in the N-type MISFET forming region 11. The diffused regions 8 constitute source and drain, and the gap therebetween constitutes a channel region. Similarly, the silicon substrate 1, pair of diffused regions 8, pair of extension regions 6, gate insulation film 3, metal gate 5 and side-wall 7 constitute the P-type MISFET in the P-type MISFET forming region 12.

When a voltage is applied to the metal gate 4 in the N-type MISFET forming region, the channel region is applied with an electric field via the gate insulation film 3, whereby the carrier concentration in the channel region is changed. This results in a change of the current flowing between the source and drain. Similarly, when a voltage is applied to the metal gate 5 in the P-type MISFET forming region, the current flowing between the source and drain is changed.

Figure 7:
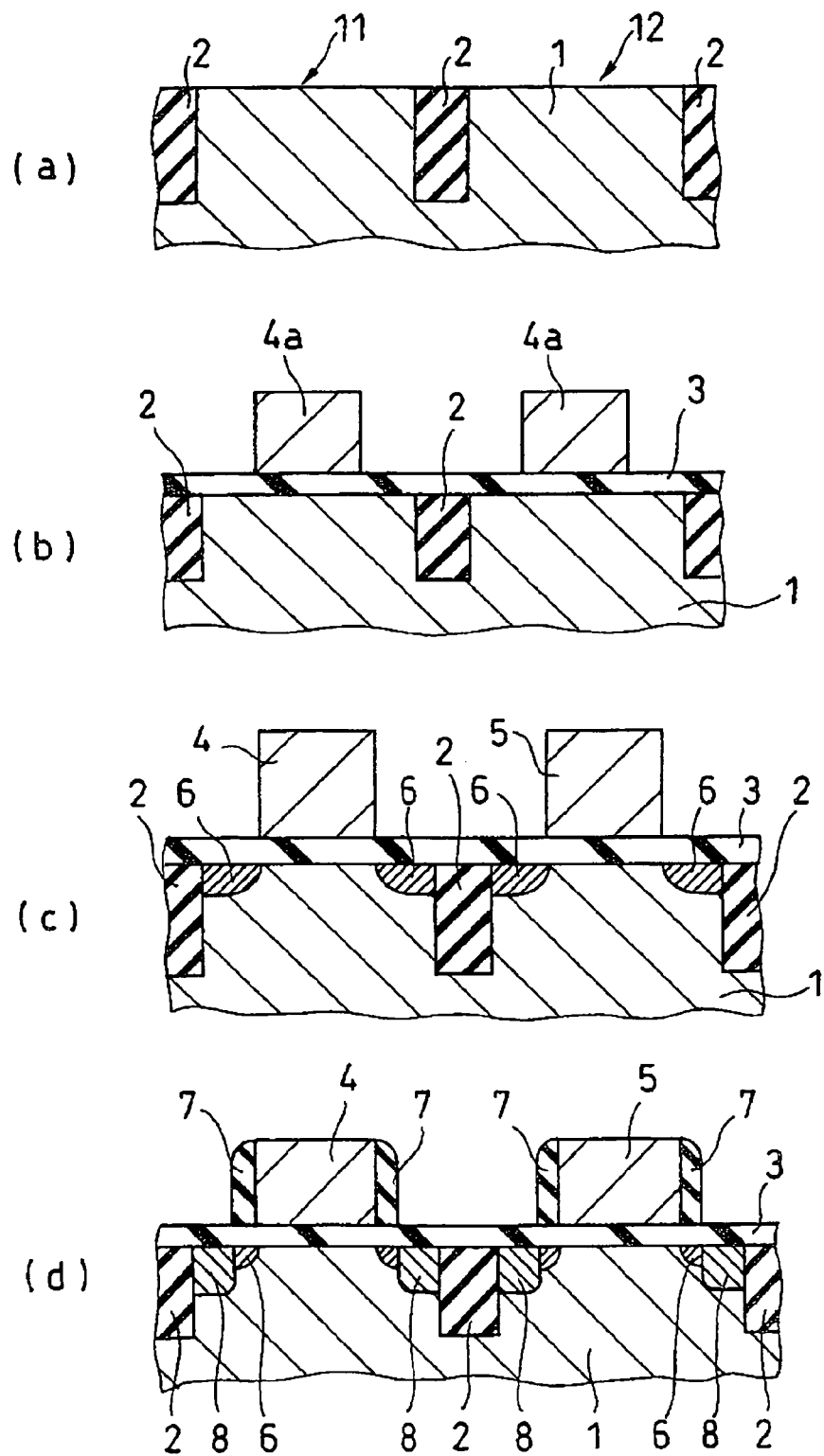
FIGS. 7(a) to (d) are sectional views showing the semiconductor device of the first embodiment in the order of fabrication steps thereof.

Next, a method for manufacturing the semiconductor device according to the first embodiment will be described. FIGS. 7(a) to 7(d) show the semiconductor device manufacturing method of the present embodiment in the order of fabrication steps. As shown in FIG. 7(a), an insulation film is selectively embedded in the surface area of the silicon substrate 1, thereby forming therein element isolation regions 2. The element isolation region 2 is formed using a LOCOS technique (local-oxidation-of-silicon technique) or an STI technique (shallow trench isolation technique), for example.

Subsequently, as shown in FIG. 7(b), a gate insulation film 3 is deposited on the silicon substrate 1 to a thickness of 1 to 3 nm. In this step, after a ten-minute treatment, wherein the deposition temperature, oxygen flow rate, nitrogen flow rate and deposition gas pressure are set at 750 degrees C., 0.05 milliliters/minute, 0.25 milliliters/minute and 6.7 Pa, is performed to deposit a silicon oxynitride film having a nitrogen concentration of 10 atomic percents and a thickness of 2 nm. Thereafter, a TiCoN film 4a is deposited on the gate insulation film 3 by using a sputtering technique or a CVD (chemical vapor deposition) technique. The TiCoN film has a content ratio of Co:N=0 to 35:0 to 20 in atomic percent, and a thickness of about 20 to 200 nm. The TiCoN film has a work function of 4.0 to 4.8 eV, which is suited to the gate electrode material of the N-type MISFET. Subsequently, the TiCoN film 4a is patterned to configure a specific gate electrode pattern. Thus, the TiCoN film 4a patterned in the N-type MISFET forming region 11 configures the metal gate 4.

Subsequently, as shown in FIG. 7(c), a resist film (not shown) is formed so as to expose therefrom the patterned TiCoN film 4a in the P-type MISFET forming region 12 and to cover the other regions. Thereafter, oxygen is selectively ion-implanted in the patterned TiCoN film 4a in the P-type MISFET forming region 12 at an acceleration voltage of 10 keV and a dosage of around $10^{13}$ to $10^{14}$ cm$^{-2}$. This results in an increase of the work function of the TiCoN film 4a by about 0.2 to 0.8 eV. Thus, the TiCoN film 4a patterned in the P-type MISFET forming region 12 is configured to the gate electrode 5.

Subsequently, As ions are implanted in a self-aligned process in the N-type MISFET forming region 11 by using the metal gate 4 as a mask. In this step, the dosage of ion implantation is $1\times10^{14}$ to $1\times10^{15}$ cm$^{-2}$, for example, and may be $5\times10^{14}$ cm$^{-2}$, for example, whereas the acceleration voltage is 2 kV, for example. Thereafter, by performing a heat treatment, the extension regions 6 in the N-type MISFET forming region 11 are formed. In this step, the temperature of the heat treatment is 900 to 1100 degrees C., for example, and the time length thereof is about 20 seconds or less, for example.

Subsequently, BF$_2$ ions are implanted in a self-aligned process into the P-type MISFET forming region 12 by using the gate electrode 5 as a mask. In this step, the dosage of ion-implantation is $1\times10^{14}$ to $1\times10^{15}$ cm$^{-2}$, for example, and may be $5\times10^{14}$ cm$^{-2}$, for example, and the acceleration voltage is 2.5 kV, for example.

Subsequently, as shown in FIG. 7(d), a silicon nitride film is deposited on the peripheries of the gate electrodes 4 and 5, followed by etch-back thereof to form side-walls 7 on the metal gates 4 and 5. Thereafter, As or P ions are implanted in a self-aligned process into the N-type MISFET forming region 11. The dosage of ion-implantation is $5\times10^{14}$ to $2\times10^{16}$ cm$^{-2}$, for example, and if As ions are implanted, the dosage of ion-implantation is $4\times10^{15}$ and the acceleration voltage thereof is 8 kV, whereas if P ions are implanted, the dosage of ion-implantation is $1\times10^{15}$ cm$^{-2}$, and the acceleration voltage is 10 kV. Subsequently, B ions are implanted in a self-aligned process in the P-type MISFET forming region. In this step, the dosage of ion-implantation is $5\times10^{14}$ to $2\times10^{16}$ cm$^{-2}$, for example, and may be $3\times10^{15}$ cm$^{-2}$, whereas the acceleration voltage is 2 keV. Thereafter, a rapid thermal annealing (RTA) is performed for impurity activation, thereby forming deep diffused regions 8, which constitute source and drain regions, as well as extension regions 6 in the P-type MISFET forming region 12. The temperature of the rapid thermal annealing is 900 to 1100 degrees C., for example, and the time length of the rapid thermal annealing is 20 seconds or less, for example.

Thereafter, as shown in FIG. 6, an interlayer dielectric film 9 made of a SiO$_2$, BPSG, AiN or low-dielectric-constant film is deposited on the gate insulation film 3 so as to embed the peripheries of the gate electrodes 4 and 5 and the side-walls 7. Thus, the semiconductor device according to the present embodiment is obtained.

It is to be noted that, if the TiCoN film configuring the metal gates 4 and 5 has a thickness of 5 nm or larger, the work function of the metal gates 4 and 5 do not change upon deposition of another metallic film on the TiCoN film. Accordingly, the resistances of the metal gates 4 and 5 may be reduced by depositing a metal gate film having a lower resistance on the TiCoN film. In addition, although TiCoN is exemplarily used as the material for configuring the gate electrodes, the gate electrodes may be configured from other materials such as TiWN or HfZrN, and may be configured from an alloy including two or more metals selected from the group consisting of Al, Si, Ti, V, Co, Ni, Ge, Zr, Nb, Mo, Ru, Hf, Ta and W, or a nitride of the alloy. Further, although an example wherein oxygen is ion-implanted into the metal gate 5 is exemplified in the present embodiment, fluorine may be ion-implanted. For example, for achieving an effect similar to the case where the oxygen is ion-implanted under the conditions of an acceleration voltage at 10 kV and a dosage of $1\times10^{13}$ (ions/cm$^2$), fluorine should be ion-implanted under the conditions of an acceleration voltage at 7 kV and a dosage at $8\times10^{12}$ (ions/cm$^2$).

As described before, in the present embodiment, the two kinds of metal gate materials for the N-type MISFET metal and P-type MISFET metal are obtained by the content control of a metal nitride film (TiCoN film 4a) and ion-implantation of oxygen. This leads to formation of metal gates having work functions respectively suited to the N-type MISFET and P-type MISFET. As a result, the thresholds of the N-type MISFET and the P-type MISFET can be reduced without involving depletion of the gate electrodes. In addition, the work functions can be controlled by adjusting the content of the TiCoN film 4a. Accordingly, even if the work function required of the metal for the N-type MISFET is changed, this can be achieved by controlling the content of the TiCoN film. Thus, a major change of the process conditions in the fabrication is not needed, whereby productivity is not reduced.

Further, in the method for fabricating the semiconductor device according to the present embodiment, since there is no step of removing a once-deposited metallic film, the gate insulation film is not damaged. Further, since two kinds of metal gate materials are differentiated from one another by the ion-implantation, the metal gates can be manufactured more easily, at a lower cost and a higher product yield, compared to the case where the two kinds of metal gate materials are deposited in separate processes. Further, the gate insulation film has a higher reliability because there are no damages on the gate insulation film caused by etching and there is no step of ion-implantation of nitrogen.

Next, a second embodiment of the present invention will be described. FIGS. 8(a) to 8(d) and 9(a) to 9(c) consecutively show a method for manufacturing a semiconductor device according to the present embodiment. The present second embodiment differs from the first embodiment in that dummy gate electrodes are formed in advance, and removed after the activation of impurities implanted in the source and drain, and then metal gates are formed. By using this method, the gate electrodes are formed from a TiZrN film or TiHfN film having a lower resistance against heat in the interface with the gate insulation film. In addition, a low-melting-point metal such as Al may be used for reducing the resistance of the gate electrode.

Figure 8:
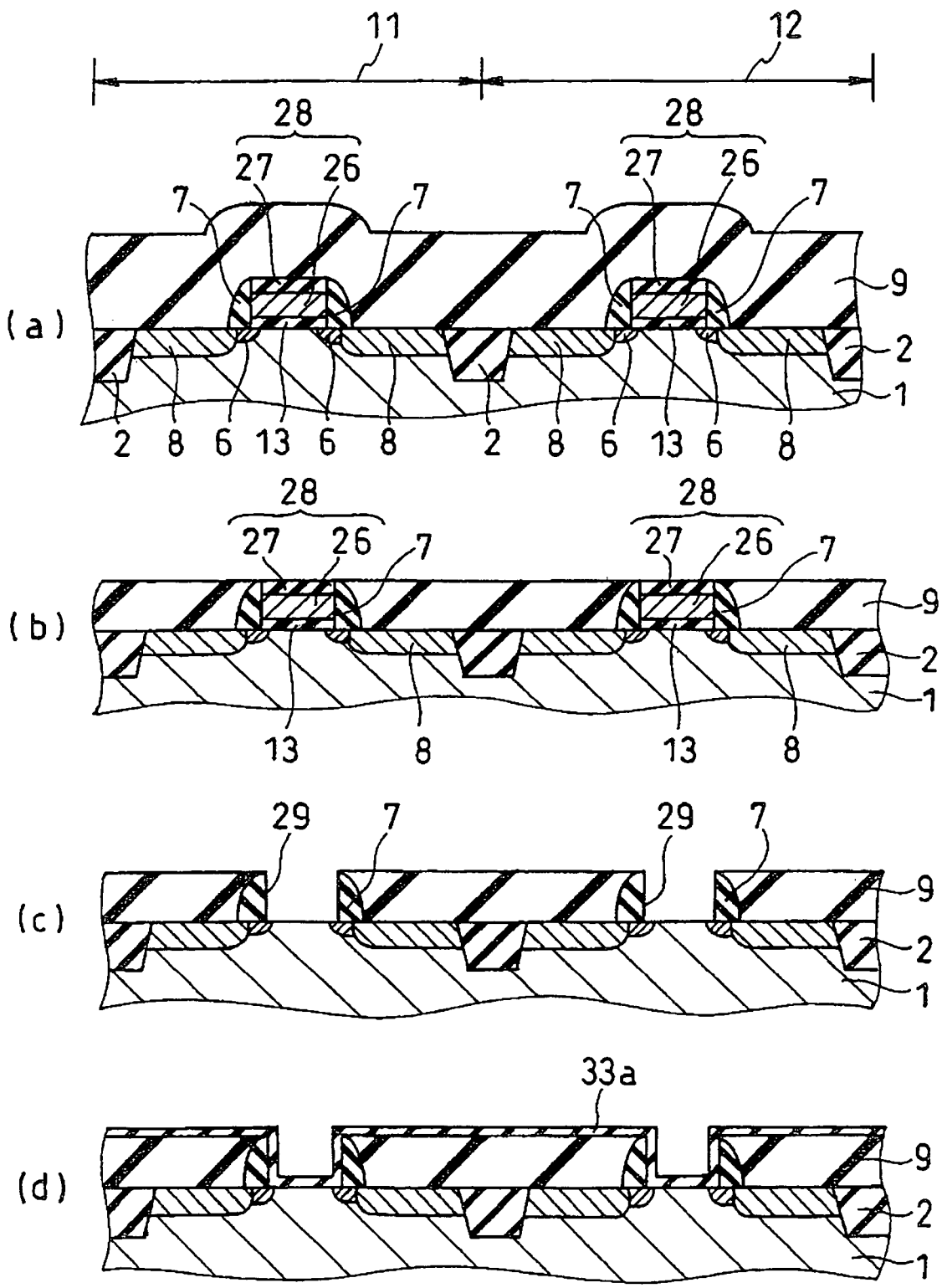
FIGS. 8(a) to (d) and FIGS. 9(a) to (c) are sectional views showing a semiconductor device according to a second embodiment of the present invention in the order of fabrication steps thereof.

First, as shown in FIG. 8(a), element isolation regions 2 are selectively formed in the surface area of the silicon substrate 1, similarly to the first embodiment. Subsequently, a silicon oxide film having a thickness of around 2 to 6 nm, for example, is formed as a dummy insulation film 13, which is to be removed in a later step. Thereafter, a polysilicon film 26 having a thickness of about 150 nm, for example, and a silicon nitride film 27 having a thickness of about 50 nm, for example are formed, to obtain layered films including the polysilicon film 26 and silicon nitride film 27. The layered films are then patterned to configure electrode patterns, to thereby obtain dummy gate electrodes 28, which are to be removed in a later step.

Subsequently, the extension regions 6, which constitute source and drain impurity-diffused regions, are formed by an ion-implantation technique using the dummy gate electrodes 28 as a mask. Then, a heat treatment for activation of impurities is performed under the conditions similar to those of the first embodiment. Thereafter, a silicon nitride film is deposited using a CVD technique, and selectively removed using an RIE technique, to thereby form side-walls 7 made from a silicon nitride film and having a width of 20 to 40 nm on the sides of the dummy gate electrode 28. Then, by an ion-implantation technique using the dummy gate electrodes 28 and sidewalls 7 as a mask, diffused regions 8 which constitute source and drain heavily-doped/impurity-diffused regions are formed. Then, a heat treatment is performed for activation of impurities under the conditions similar to those of the first embodiment. Subsequently, a silicide film (not shown) having a thickness of about 40 nm, for example, is formed only in the source and drain regions by a salicide process technique using the dummy gate electrodes 28 and side-walls 7 as a mask. Thereafter, an interlayer dielectric film 9 is formed by depositing a silicon oxide film, for example, while using a CVD technique.

Subsequently, as shown in FIG. 8(b), the surface of the interlayer dielectric film 9 is subjected to a planar process using a CMP technique to expose therefrom the surface of the dummy gate electrodes 28, i.e., the surface of the silicon nitride film 27.

Subsequently, as shown in FIG. 8(c), the silicon oxide film 27 on top of the dummy gate electrodes 28 is removed selectively from the interlayer dielectric film 9 by using phosphoric acid, for example. This results in exposure of the polysilicon film 26. Subsequently, the polysilicon film 26 is removed selectively from the interlayer dielectric film 9 and side-walls 7 by an etching technique using radicals of fluorine etc. Then, a wet etching using dilute hydrofluoric acid etc. is performed to remove the dummy insulation film 13 made from the silicon oxide film, thereby forming trenches 29. Subsequently, as shown in FIG. 8(d), a high-dielectric-constant insulation film such as alumina film 33a, for example, which constitutes a gate insulation film 33 (refer to FIG. 9(c)), is formed over the entire surface by using an ALCVD technique.

Figure 9:
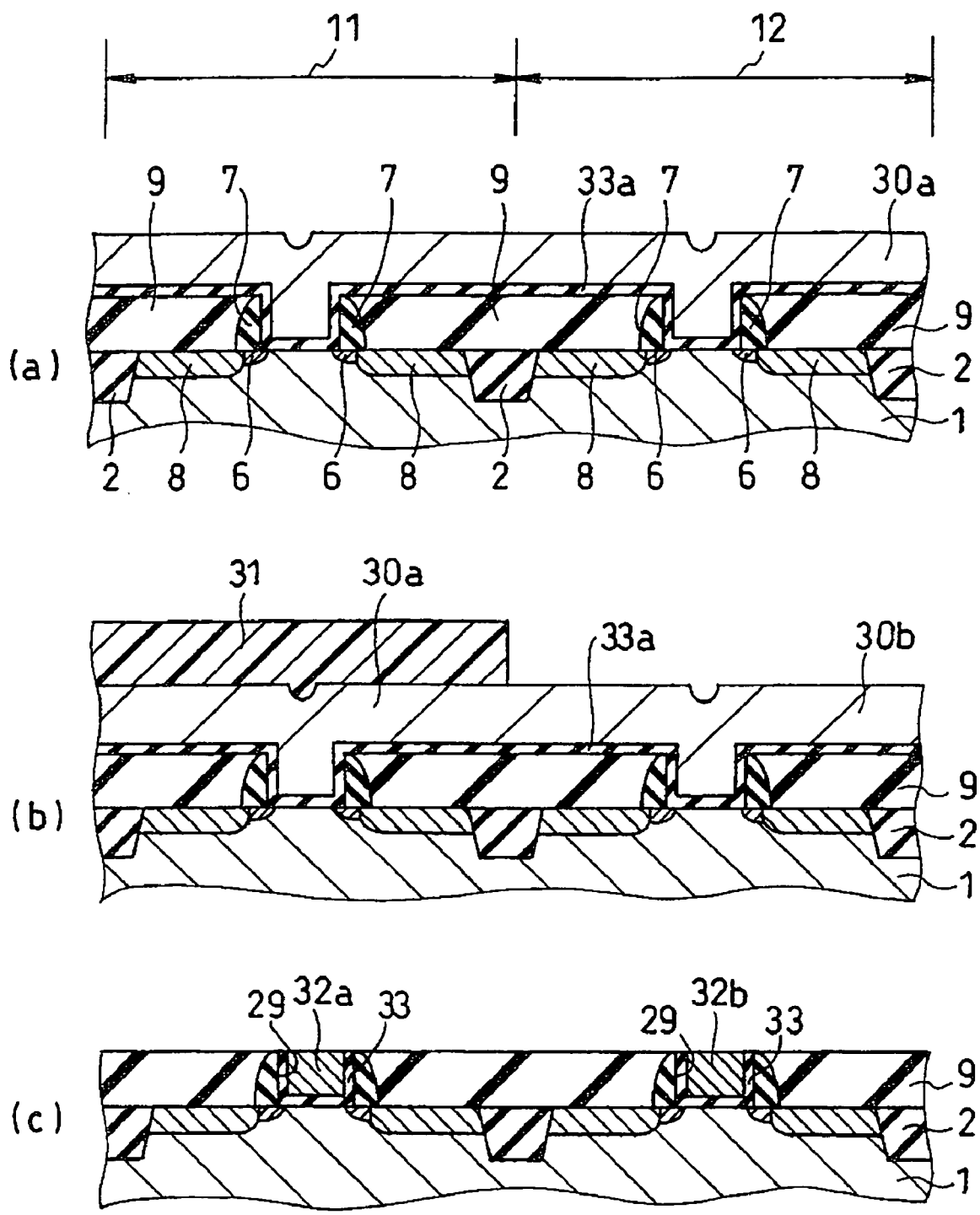

Subsequently, as shown in FIG. 9(a), a TiHfN film 30a having a work function of 4.0 to 4.5 eV and suited to the gate electrode material for the N-type MISFET is deposited by a CVD technique or sputtering technique on the alumina film 33a to a thickness of about 20 nm, for example.

Subsequently, as shown in FIG. 9(b), regions other than the P-type MISFET forming regions are covered with a resist 31, followed by ion-implantation of fluorine at an acceleration voltage of 10 keV and a dosage of around $1\times10^{13}$ ions/cm$^2$. This allows the work function of the portion 30b of the TiHfN film 30a corresponding to the P-type MISFET forming region 12 to increase by about 0.4 eV compared to the other portion of the TiHfN film 30a.

Subsequently, as shown in FIG. 9(c), the resist 31 is removed, followed by a planar process using CMP, to remove the TiHfN film 30a and the alumina film 33a on the interlayer dielectric film 9.

Thereby, the interlayer dielectric film 9 is exposed, and the gate insulation film 33 made of alumina film 33a and the gate electrode 32a made of TiHfN film are formed within the trench 29 in the N-type MISFET forming region 11, whereas the gate insulation film made of alumina film 33a and the gate electrode 32b made of TiHfN film are formed within the trench 29 in the P-type MISFET forming region 12.

In the present embodiment, by selectively ion-implanting fluorine into the TiHfN film 30a, which constitutes the gate electrode material, the gate electrode 32a of the N-type MISFET and the gate electrode 32b of the P-type MISFET can be differentiated in the fabrication, and both the N-type MISFET and the P-type MISFET can be operated at lower thresholds. In the present embodiment, the dummy insulation film 13 and dummy gate electrodes 28 are formed and used as a mask for impurity implantation, followed by performing a heat treatment for activation of the impurities, removal of the dummy gate electrode 28 and dummy insulation film 13, and formation of the gate insulation film 33 and gate electrodes 32a and 32b. This prevents the gate insulation film 33 and gate electrodes 32a and 32b from being exposed to the heat treatment. As a result, the TiHfN film having a lower resistance against heat in the interface with the gate insulation film can be used as a gate electrode material. It is to be noted that the gate electrode may be formed from a TiZrN film in the present embodiment.

Next, change of the work function will be described in the case where films each made of a metal, alloy or nitride thereof (hereinafter referred to as collectively metallic film) are layered. The present inventors found that, when two kinds of metallic films were layered one on another, the work function of the layered films exhibited a tendency similar to that of the case where the materials configuring these metallic films were alloyed. More specifically we found that the behavior of change of the work function when the thickness ratio of the layered films was changed exhibited a tendency similar to the tendency of the work function when the content ratio of the alloy was changed. Accordingly, if the relationship between the content ratio and the work function of the alloy shown in the first embodiment is known, by layering the materials configuring the alloy film one on another to form layered films, the work function of the layered films can be predicted.

Figure 10:
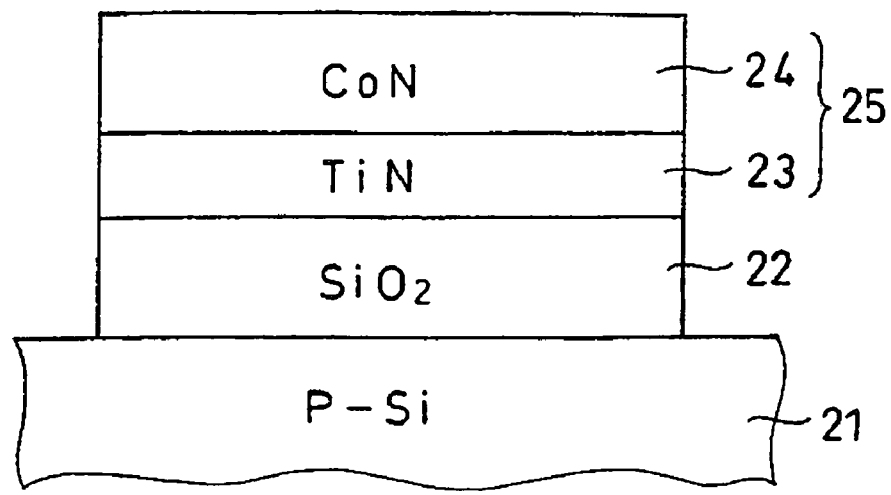
FIG. 10(a) is a side view showing the test method for investigating the relationship between the work function of layered films and thickness ratio.
FIG. 10(b) is a graph showing the influence caused by the average thickness of the TiN film on the work function of the layered films, wherein the average thickness of the TiN film shown in FIG. 10(a) is plotted on the abscissa and the work function of the layered films shown in FIG. 10(a) is plotted on ordinate.
Figure 10:
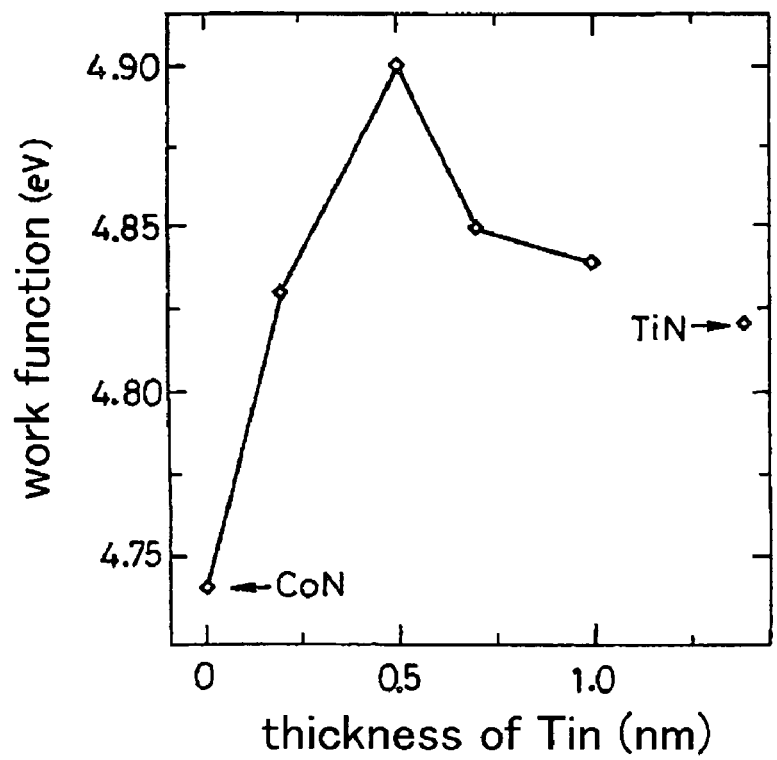

FIG. 10(a) is a side view showing the experimental method for investigating the relationship between the work function and the thickness ratio of the layered films, and FIG. 10(b) is a graph showing the influence caused by the average thickness of the TiN film on the work function of the layered films, wherein the average thickness of a TiN film shown in FIG. 10(a) is plotted on abscissa and the work function of the layered films shown in FIG. 10(a) is plotted on ordinate. As shown in FIG. 10(a), a 10-nm-thick Si thermal oxide film ($SiO_2$) 22 is formed on a P-type Si substrate (P—Si) 21, followed by consecutively forming thereon a TiN film 23 and a Co film 24 by a sputtering technique. It is to be noted that the TiN film 23 may be omitted. In this step, the thickness of the intermediate TiN film 23 is changed within the range from 0 nm (the case where no TiN film is formed) to 1.0 nm. The thickness of the CoN film 24 is set at 30 nm. The Si thermal oxide film 22, TiN film 23 and CoN film 24 are patterned to configure a circle having a diameter of around 0.1 mm. Then, the work function of the layered films 25 including the TiN film 23 and CoN film 24 is measured.

As shown in FIG. 10(b), the work function increases with the increase of the thickness of the TiN film 23 within the thickness range of the TiN film 23 between 0 and 0.5 nm, whereas the work function decreases with the increase of the thickness of the TiN film 23 within the thickness range of the TiN film 23 from 0.5 to 1.0 nm. This is similar to the change of the work function when TiN is introduced into CoN in FIG. 1 shown before. That is, when the TiN film 23 is provided to underlie the CoN film 24, an effect similar to the effect of alloying by introducing TiN in CoN is obtained. Accordingly, by layering the TiN film and CoN film one on another, the work function of the whole layered films can be controlled. This is considered due to the fact that electron dipoles are formed in the interface between the TiN film and the CoN film to change the work function. It is to be noted that since the TiN film 23 is formed by a sputtering technique, the TiN film is grown in an island structure having convex and concave surfaces. If the TiN film is formed by an atomic layer growth technique etc., a similar effect can be obtained with a smaller film thickness. Thus, it is preferable that the TiN film be a continuous film. The average thickness of the TiN film is a thickness obtained by measuring the concentration profile of the TiN film and calculating the thickness thereof based on the concentration profile while assuming it is a continuous film made of pure TiN.

Figure 11:
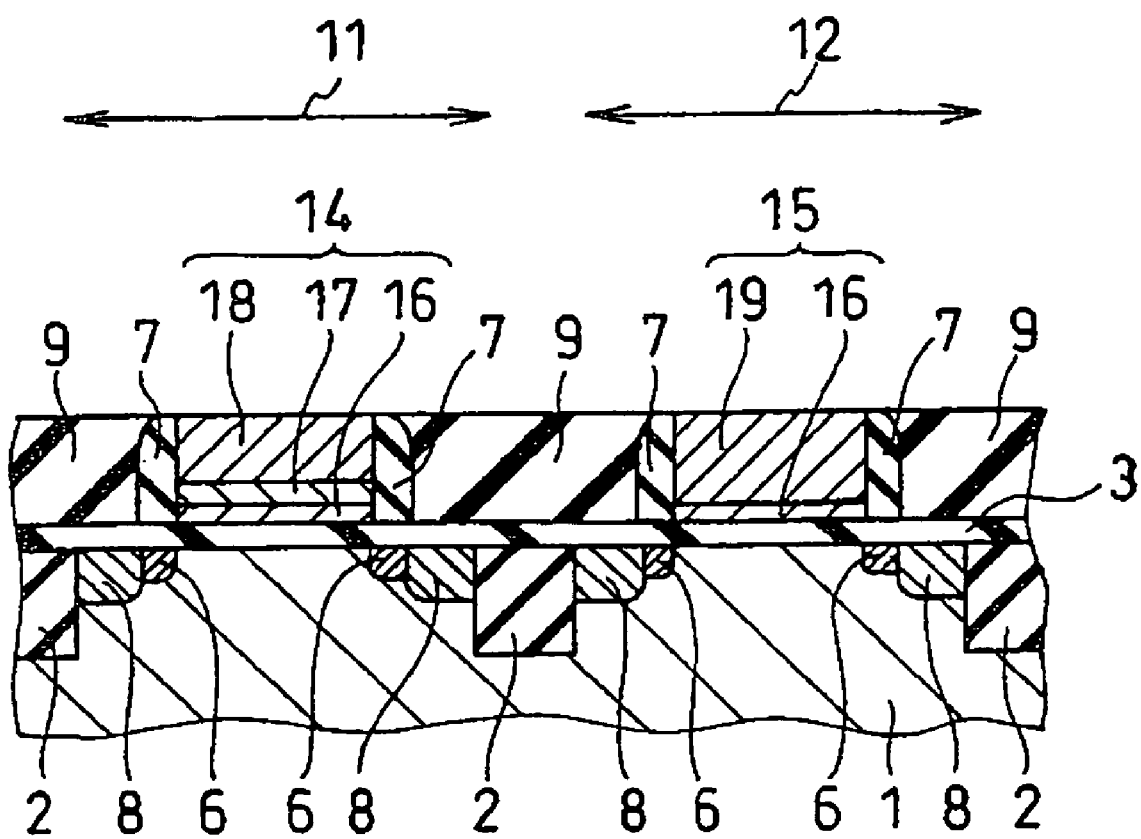
FIG. 11 is a sectional view of a semiconductor device according to a third embodiment of the present invention.

By using the above characteristic during differentiation of the metal gate of the N-type MISFET and the metal gate of the P-type MISFET from one another in the fabrication thereof, the work functions of the metal gates can be controlled as desired and the process damaging the gate insulation film by removal of the gate electrodes can be avoided, A third embodiment of the present invention will be described. FIG. 11 shows a semiconductor device of the present embodiment. As shown in FIG. 11, the semiconductor device of the third embodiment differs from the semiconductor device of the above first embodiment in that the gate electrode of the N-type MISFET is comprised of layered films. It is to be noted that, although the gate electrode of the P-type MISFET is also layered in two steps, the composition of the layers is same and thus it is difficult to distinguish the layers from one another after the layering. The structure of the semiconductor device of the third embodiment is similar to the structure of the semiconductor device of the first embodiment except for the gate electrodes.

In the present embodiment, a metal gate 14 is formed on the gate insulation film 3 in the N-type MISFET forming region 11 whereas a metal gate 15 is formed on the gate insulation film 3 in the P-type MISFET forming region 12. The metal gate 14 in the N-type MISFET forming region 11 is formed as a three-layer film. A TiCoN film 16 is formed as a bottom layer in contact with the gate insulation film 3 in the metal gate 14. The average thickness of the TiCoN film 16 is 0.5 nm, for example, the atomic ratio thereof is T:Co=5:95, for example, and work function thereof is 4.9 eV. A TiN film 17 having an average thickness of about 5 nm or above, for example, is formed on the TiCoN film 16. Another TiCoN film 18 having an average thickness of about 200 nm, for example, is formed on the TiN film 17. The content ratio and work function of the TiCoN film 18 are similar to those of the TiCoN film 16.

On the other hand, the metal gate 15 in the P-type MISFET forming region 12 is formed as a two-layer film. A TiCoN film 16 having an average thickness of 0.5 nm, for example, and an atomic ratio of Ti:Co=5:95 is formed as the bottom layer in contact with the gate insulation film 3 in the metal gate 15. A TiCoN film 19 having an average thickness of about 200 nm, for example, and an atomic ratio of Ti:Co=5:95, for example, is formed on the TiCoN film. 16. The work function of the metal gate 14 is 4.4 eV, for example, whereas the work function of the metal gate 15 is 4.9 eV, for example. The thickness of the TiCoN films 18 and 19 may be 5 nm, for example, and a low-resistance metallic film such as made of Al and having a thickness of about 200 nm, for example, may be layered on the TiCoN films 18 and 19.

It is preferable that the average thickness of the TiCoN film be 0.1 to 5 nm. If the average thickness of the TiCoN film 16 is smaller than 0.1 nm, it means that an average thickness is smaller than one atomic layer and thus a continuous film cannot be obtained. Thus, the effect for protecting the gate insulation film against the etching is reduced. On the other hand, if the average thickness of the TiCoN film 16 is larger than 5 nm, the contribution of the TiN film 17 to the work function of the whole metal gate 14 is reduced, and thus the work function of the whole metal gate 14 becomes excessively higher.

Next, a method for manufacturing the semiconductor device of the third embodiment will be described. First, by using a process similar to that for the first embodiment, element isolation regions 2 are formed in the surface area of the silicon substrate 1, followed by forming the gate insulation film 3 on the silicon substrate 1. Subsequently, as shown in FIG. 11, the TiCoN film 16 is formed on the gate insulation film 3 to a thickness of 0.5 nm, for example. The TiCoN film 16 has an atomic ratio of Ti:Co=5:95, for example, and this content ratio allows the work function of the TiCoN film 16 to assume 4.9 eV, for example, suited to the gate electrode of the P-type MISFET.

Subsequently, the TiN film 17 is layered on the TiCoN film 16 to a thickness of 5 nm or above, followed by removing only a portion of the TiN film 17 on the P-type MISFET forming region 12 by using a photolithographic technique and an RIE (reactive ion etching) technique. Since the etch selectivity between TiCoN and TiN is large, only the TiN film 17 is removed without etching the TiCoN film 16.

Subsequently, another TiCoN film is formed on the TiN film 17 in the N-type MISFET forming region 11 and on the TiCoN film 16 in the P-type MISFET forming region 12. This allows the TiCoN film 18 to be formed on the TiN film 17, and allows the TiCoN film 19 to be formed on the TiCoN film 16. Then, the TiCoN film 16, TiN film 17, TiCoN film 18 and TiCoN film 19 are patterned. As a result, the metal gate 14 including the TiCoN film 16, TiN film 17 and TiCoN film 18 is formed, whereas the metal gate 15 including the TiCoN film 16, TiN film 17, TiCoN film 18 and TiCoN film 19 is formed.

Thereafter, the extension regions 6 and diffused regions 8 are formed in the surface area of the silicon substrate 1 by using a process similar to the first embodiment (refer to FIGS. 7(c) and 7(d)), followed by forming the side-walls 7 and interlayer dielectric film 9 on the gate insulation film 3, thereby achieving the semiconductor device of the present embodiment.

As described above, in the present embodiment, two kinds of metal gate materials for the N-type MISFET metal and P-type MISFET metal are manufactured by the content control and control of the layered structure of the metal nitride film. Thereby, the work function of the metal gate is controlled to differentiate the metal gate of the N-type MISFET and the metal gate of the P-type MISFET in fabrication thereof, without damaging the gate insulation film. As a result, a semiconductor device having lower thresholds for both the N-type MISFET and P-type MISFET can be obtained, without involving depletion of the gate electrodes. In addition, in the present embodiment, since there is no damage of the gate insulation film caused by the etching as well as no ion-implantation of nitrogen, the gate insulation film has a higher reliability. Further, since the fabrication is easy to achieve, the fabrication cost is lower and the product yield is higher.

As described in the background technology, for differentiation of the N-type MISFET and P-type MISFET in the conventional technique, for example, a metallic film for the gate electrode of the N-type MISFET is formed on the entire surface of the wafer, then a portion of the metallic film on the P-type MISFET is removed, and another metallic film for the gate electrode of the P-type MISFET is again formed. There is another technique wherein, after a dummy gate electrode is formed for the P-type MISFET, a metallic film for the gate electrode of the N-type MISFET is formed on the entire surface, followed by removing the dummy gate electrode and forming another metallic film for the gate electrode of the P-type MISFET on the gate insulation film of the P-type MISFET. In either fabrication process, there is a step of removing the metallic film for the gate electrode or dummy gate electrode, to damage the gate insulation film in this process.

On the contrary, in the present embodiment, one of the metal gates is formed from layered films to differentiate the N-type MISFET and the P-type MISFET in the fabrication. This process does not remove the metallic film in contact with the gate insulation film in both the N-type MISFET and P-type MISFET, and controls to change the work function in both the cases of layering the same metal and the different metal. Thus, the gate insulation film is not damaged.

Although the case of layering the TiCoN film and the TiN film is shown in the present embodiment, the present invention is not limited thereto. The above property is obtained not only in the case of TiN and CoN, and the work function can be controlled in the case of forming a layered structure including metals such as Al, Si, Ti, V, Cr, Fe, Co, Ni, Cu, Zn, Ge, Zr, Nb, Mo, Ru, Rh, Pd, Hf, Ta, W, Re, Os, Ir and Pt, alloys including these metallic materials and nitrides of these metals or alloys. It is to be noted that different work functions can be obtained from the metallic materials selected. In the combination of these metallic materials, by selecting a combination which allows a higher etch selectivity and first forming a metallic film having a lower etch rate, the metal gate can be obtained without damaging the gate insulation film. Oxygen or fluorine may be added in the TiCoN film and TiN film in the present embodiment, similarly to the first embodiment, whereby work function of each film can be controlled in a wider range.

If there is a high-temperature process at a temperature equal to or above 400 degrees C. after formation of the gate electrodes, and a pure metal is used as a film underlying the metal gates, then there will be a reaction in the interface between the pure metal film and the gate insulation film (for example, silicon oxide film) in the high-temperature process, thereby deviating the threshold from the design value. Thus, it is preferable to select a metal nitride film having a higher thermal stability as the film underlying the metal gate. However, it is possible to form dummy gate insulation film and dummy gate electrode, followed by ion-implantation and activation of impurities, removal of the dummy gate insulation film and dummy gate electrode and formation of the gate insulation film and gate electrode in the present embodiment, as in the second embodiment. This allows a material having a relatively lower resistance against heat can be used as the gate electrode material. For example, a HfN film is used as the gate electrode of the N-type MISFET, and layered films including a HfN film and a WN film may be sued as the gate electrode of the P-type MISFET.

According to the embodiments of the present invention as detailed heretofore, formation of the gate electrode of the metal-insulator-semiconductor field-effect transistor by using a material wherein a metal, an alloy or a metal nitride is doped with oxygen or fluorine allows the work function of the gate electrode to be controlled as desired, thereby achieving a semiconductor device including metal-insulator-semiconductor field-effect transistors having lower thresholds. In addition, formation of a film made of a metal, alloy or metal nitride in the N-type MISFET forming region and the P-type MISFET forming region and ion-implantation of oxygen or fluorine into the film allows the metal gates of the N-type MISFET and P-type MISFET to be differentiated in fabrication, thereby operating the MISFETs at respective lower threshold voltages. In addition, the two kinds of metal gates can be manufactured at a lower cost and a higher product yield. Further, since there is no damage on the gate insulation film, the reliability of the gate insulation film is not degraded. In these gate electrodes, since there occurs no depletion, it is suited to a higher speed operation of the semiconductor device having a gate length of 0.1 μm or less.

Although the present invention is described with reference to the preferred embodiments thereof, the present invention is not limited only to the structures of the embodiments, and various modifications or alterations can be 20 made the above embodiments without departing from the scope of the present invention.

The invention claimed is:

1. A semiconductor device comprising an N-channel metal-insulator-semiconductor field-effect transistor and a P-channel metal-insulator-semiconductor field-effect transistor, characterized in that said N-channel metal-insulator-semiconductor field-effect transistor includes a gate electrode made of a metal, alloy or metal nitride film doped with oxygen or fluorine, and that said P-channel metal-insulator-semiconductor field-effect transistor includes a gate electrode formed in a common layer with said gate electrode of said N-channel metal-insulator-semiconductor field-effect transistor and made from a portion of said common layer doped with oxygen or fluorine more heavily than said gate electrode of said N-channel metal-insulator-semiconductor field-effect transistor.

2. A semiconductor device comprising an N-channel metal-insulator-semiconductor field-effect transistor and a P-channel metal-insulator-semiconductor field-effect transistor, characterized in that said N-channel metal-insulator-semiconductor field-effect transistor includes a gate electrode made from a metal, alloy or metal nitride film, and that said P-channel metal-insulator-semiconductor field-effect transistor includes a gate electrode formed in a common layer with said gate electrode of said N-channel metal-insulator-semiconductor field-effect transistor and made from a portion of said common layer doped with oxygen or fluorine.

3. The semiconductor device according to any one of claims 1 or 2, wherein a material configuring said gate electrode of said N-channel metal-insulator-semiconductor field-effect transistor and said gate electrode of said P-channel metal-insulator-semiconductor field-effect transistor is polycrystalline or amorphous and has an average grain size of 50 nm or less.

4. The semiconductor device according to any one of claims 1 or 2, wherein a material configuring said gate electrode of said N-channel metal-insulator-semiconductor field-effect transistor and said gate electrode of said P-channel metal-insulator-semiconductor field-effect transistor is made of an alloy including two or more metals selected from the group consisting of Al, Si, Ti, V, Co, Ni, Ge, Zr, Nb, Mo, Ru, Hf, Ta and W or a nitride of said alloy.

5. The semiconductor device according to claim 4, wherein said material configuring said gate electrode is made of said nitride of said alloy including Ti and a metal selected from the group consisting of Al, Si, V, Co, Ni, Ge, Zr, Nb, Mo, Ru, Hf, Ta and W.

6. The semiconductor device according to 5, wherein said material configuring said gate electrode is made of TiCoN or TiWN.

7. The semiconductor device according to claim 5, wherein said material configuring said gate electrode of said N-channel metal-insulator-semiconductor field-effect transistor and said gate electrode of said P-channel metal-insulator-semiconductor field-effect transistor is a nitride of an alloy including two or more metals selected from the group consisting of Al, Hf and Zr.

8. The semiconductor device according to claim 7, wherein a material configuring said gate electrode of said N-channel metal-insulator-semiconductor field-effect transistor and said gate electrode of said P-channel metal-insulator-semiconductor field-effect transistor is HfZrN.

9. The semiconductor device according to any one of claims 1 or 2, wherein an oxygen or fluorine profile of said gate electrode of said P-channel metal-insulator-semiconductor field-effect transistor with respect to a thickness direction thereof has a peak within 5 nm from an interface with said gate insulation film.

10. The semiconductor device according to any one of claims 1 or 2, wherein a work function of a material configuring said gate electrode of said P-channel metal-insulator-semiconductor field-effect transistor is 0.1 eV higher than a work function of a material configuring said gate electrode of said N-channel metal-insulator-semiconductor field-effect transistor.

11. The semiconductor device according to claim 3, wherein a material configuring said gate electrode of said N-channel metal-insulator-semiconductor field-effect transistor and said gate electrode of said P-channel metal-insulator-semiconductor field-effect transistor is made of an alloy including two or more metals selected from the group consisting of Al, Si, Ti, V, Co, Ni, Ge, Zr, Nb, Mo, Ru, Elf, Ta and W or a nitride of said alloy.

12. The semiconductor device according to claim 5, wherein an oxygen or fluorine profile of said gate electrode of said P-channel metal-insulator-semiconductor field-effect transistor with respect to a thickness direction thereof has a peak within 5 nm from an interface with said gate insulation film.

13. The semiconductor device according to claim 6, wherein an oxygen or fluorine profile of said gate electrode of said P-channel metal-insulator-semiconductor field-effect transistor with respect to a thickness direction thereof has a peak within 5 nm from an interface with said gate insulation film.

14. The semiconductor device according to claim 7, wherein an oxygen or fluorine profile of said gate electrode of said P-channel metal-insulator-semiconductor field-effect transistor with respect to a thickness direction thereof has a peak within 5 nm from an interface with said gate insulation film.

15. The semiconductor device according to claim 8, wherein an oxygen or fluorine profile of said gate electrode of said P-channel metal-insulator-semiconductor field-effect transistor with respect to a thickness direction thereof has a peak within 5 nm from an interface with said gate insulation film.

16. The semiconductor device according to claim 5, wherein a work function of a material configuring said gate electrode of said P-channel metal-insulator-semiconductor field-effect transistor is 0.1 eV higher than a work function of a material configuring said gate electrode of said N-channel metal-insulator-semiconductor field-effect transistor.

17. The semiconductor device according to claim 6, wherein a work function of a material configuring said gate electrode of said P-channel metal-insulator-semiconductor field-effect transistor is 0.1 eV higher than a work function of a material configuring said gate electrode of said N-channel metal-insulator-semiconductor field-effect transistor.

18. The semiconductor device according to claim 7, wherein a work function of a material configuring said gate electrode of said P-channel metal-insulator-semiconductor field-effect transistor is 0.1 eV higher than a work function of a material configuring said gate electrode of said N-channel metal-insulator-semiconductor field-effect transistor.

19. The semiconductor device according to claim 8, wherein a work function of a material configuring said gate electrode of said P-channel metal-insulator-semiconductor field-effect transistor is 0.1 eV higher than a work function of a material configuring said gate electrode of said N-channel metal-insulator-semiconductor field-effect transistor.

* * * * *

UNITED STATES PATENT AND TRADEMARK OFFICE
CERTIFICATE OF CORRECTION

| | | |
|---|---|---|
| PATENT NO. | : 7,564,102 B2 | Page 1 of 1 |
| APPLICATION NO. | : 10/507615 | |
| DATED | : July 21, 2009 | |
| INVENTOR(S) | : Takuya Yoshihara | |

It is certified that error appears in the above-identified patent and that said Letters Patent is hereby corrected as shown below:

On the title page, item:

(73) Assignee: Delete "Seiko Epson Corporation" and insert --NEC Corporation--

Signed and Sealed this

Fifteenth Day of September, 2009

David J. Kappos
*Director of the United States Patent and Trademark Office*